(12) United States Patent
Cho et al.

(10) Patent No.: US 6,552,902 B2
(45) Date of Patent: Apr. 22, 2003

(54) TURBINATE HEAT SINK

(75) Inventors: Eric Cho, Tu-Chen (TW); Carey Lai, Tu-Chen (TW); Mark Lin, Tu-Chen (TW)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 0 days.

(21) Appl. No.: 09/822,909

(22) Filed: Mar. 29, 2001

(65) Prior Publication Data

US 2002/0036893 A1 Mar. 28, 2002

(30) Foreign Application Priority Data

Sep. 26, 2000 (TW) .................................... 89216652 U

(51) Int. Cl.[7] ................................................. H05K 7/20
(52) U.S. Cl. ................... 361/704; 165/80.3; 165/121; 165/185; 257/722; 361/697; 361/710
(58) Field of Search ..................... 165/80.3, 121–124, 165/185, 908; 361/687–688, 694–695, 697; 415/177–178; 257/722

(56) References Cited

U.S. PATENT DOCUMENTS

| 4,838,041 A | * | 6/1989 | Bellows et al. ............. 165/908 |
| 5,132,780 A | * | 7/1992 | Higgins, III ................. 361/697 |
| 5,597,034 A | * | 1/1997 | Barker, III et al. ........ 165/80.3 |
| 6,196,300 B1 | * | 3/2001 | Chechetti .................... 361/697 |

* cited by examiner

*Primary Examiner*—Gregory Thompson
(74) *Attorney, Agent, or Firm*—Wei Te Chung

(57) ABSTRACT

A heat sink (10) includes a circular base (20), a plurality of fins (30), and a central post (40). The base is adapted to be in thermal contact with an electronic device, to remove heat therefrom. The post extends from a top surface (26) of the base. The post has a first surface connected to the top surface and a second surface (44) dimensioned according to a heat sink fan to be attached thereon. The post also has a concave side surface (42) between the second surface of the post and the top surface of the base, for directing airflow. The fins are identical in height to the post. The fins are curved, aligned and spaced from each other at uniform intervals corresponding to directions of airflow generated from the fan. These minimize resistance to cooling air entering or exiting the heat sink.

12 Claims, 4 Drawing Sheets

TURBINATE HEAT SINK

BACKGROUND OF THE INVENTION

1. Field of the Invention

The present invention relates to a heat sink, and more particularly to a heat sink having components with minimal resistance to forced airflow.

2. Related Art

In contemporary computers, the most common kind of heat-generating electronic device is a Central Processing Unit (CPU). The CPU is the most important controller of electronic signals in a typical computer. A great deal of heat is generated by contemporary CPUs during normal operation. This can deteriorate the stability and operation of the CPU. Thus heat must be removed from the CPU quickly, to ensure proper operation of the computer. Oftentimes, a heat sink is mounted on a top surface of the CPU to remove heat therefrom.

A conventional heat sink includes a base positioned in contact with a CPU, and a plurality of fins radially extending from a center of the base. A rotary heat sink fan is frequently attached to a top of the heat sink, for providing forced airflow and facilitating heat convection.

Blades of the fan revolve and create centrifugal outgoing airflow. The directions of such airflow correspond to the orientation of the blades. When such air enters a conventional heat sink, it strikes the radial fins, rebounds, and also creates obstructing airflow. Additionally, part of the air emitted by the fan strikes a top surface of the base, rebounds back toward the fan, and creates obstructing airflow. All this retards air from entering the heat sink and exiting the heat sink, and thus reduces the efficiency of forced convection.

Examples of conventional heat sinks are disclosed in U.S. Pat. No. 5,794,685 and in Taiwan Patent Application No. 84310595.

SUMMARY OF THE INVENTION

Accordingly, an object of the present invention is to provide a heat sink which minimizes resistance to incoming forced airflow and outgoing airflow, and thus enhances heat convection.

To achieve the above object, a heat sink comprises a circular base, a plurality of fins and a central post. The base is adapted to be in thermal contact with an electronic device, to remove heat therefrom. The post extends from a top surface of the base. The post has a first surface connected to the top surface and a second surface dimensioned according to a rotary heat sink fan to be attached thereon, to minimize blockage of cooling air emitted from the fan. The post also has a concave side surface connected between the second surface of the post and the top surface of the base, for directing airflow toward an exterior of the heat sink and minimizing resistance to incoming airflow. The fins are identical in height to the post, so that cooling air emitted by the fan passes directly into the heat sink. The fins are curved, aligned and spaced from each other at uniform intervals corresponding to directions of airflow generated from the fan. This minimizes resistance to cooling air entering and exiting the heat sink.

Other objects, advantages and novel features of the present invention will be drawn from the following detailed embodiments of the present invention with attached drawings, in which:

DETAILED DESCRIPTION OF THE PREFERRED EMBODIMENTS

Figure 1:
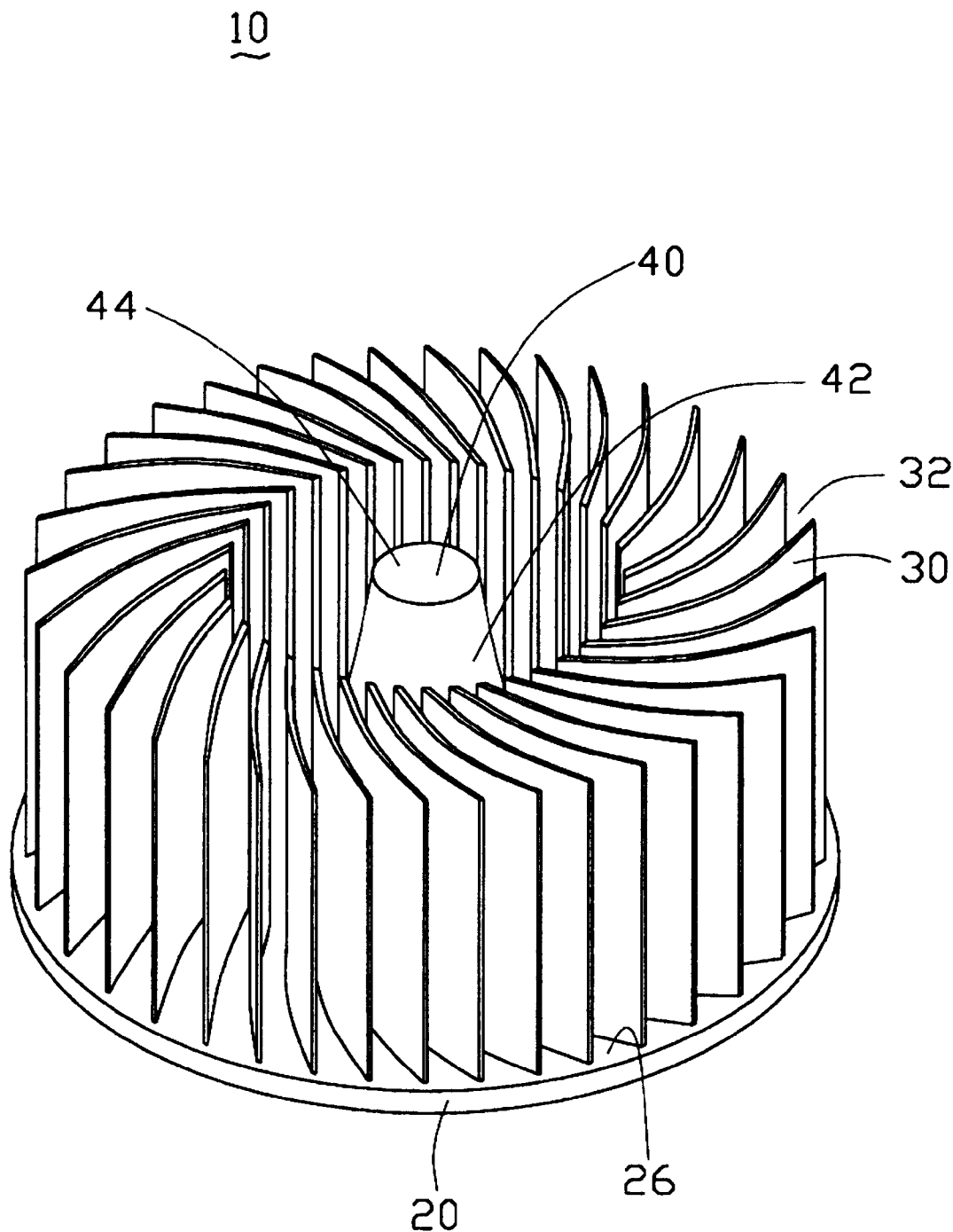
FIG. 1 a perspective view of a heat sink in accordance with a preferred embodiment of the present invention.

FIG. 1 shows a heat sink 10 in accordance with a preferred embodiment of the present invention, for removing heat from an electronic device such as a central processing unit (CPU) (not shown). The heat sink 10 is formed as a single unit. The heat sink 10 comprises a circular base 20, a plurality of fins 30, and a central post 40.

The post 40 extends upwardly from a top surface 26 of the base 20, and is coaxial with the base 20. The post 40 includes a first surface (not labeled), a second surface 44 and a concave side surface 42. The first and second surfaces are substantially round. The first surface is connected to the top surface 26 of the base 20. The second surface 44 is smaller than the first surface, dimensioned according to a rotary heat sink fan (not shown) to be attached thereon. The concave side surface 42 is connected between the first and second surfaces for minimizing resistance to incoming airflow and directing airflow toward an exterior of the heat sink 10.

The fins 30 extend upwardly from the top surface 26 of the base 20 around the post 40, and are identical in height to the post 40. The fins 30 are curved, aligned, and spaced from each other at uniform intervals corresponding to directions of airflow generated from the fan. Gaps 32 are defined between adjacent fins 30, for providing airflow access.

Figure 2:
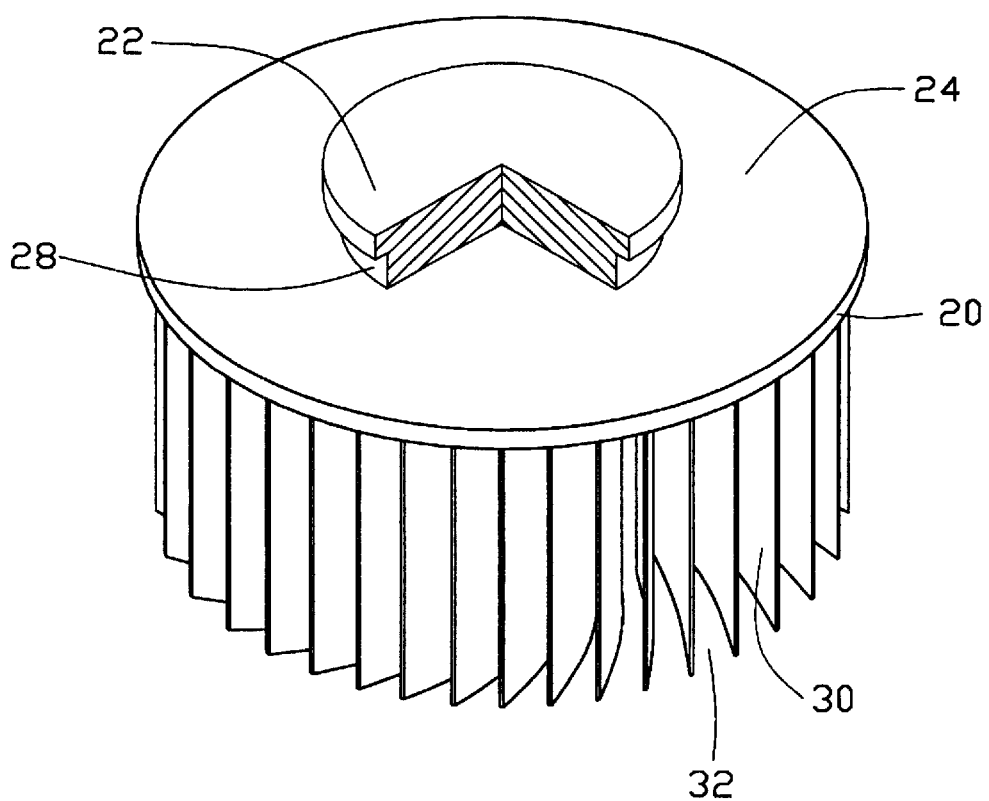
FIG. 2 is a perspective view of the heat sink of FIG. 1, but viewed from another angle and showing part of the heat sink cut away.

Referring also to FIG. 2, a circular support portion 22 extends perpendicularly from a bottom surface 24 of the base 20, coaxially with the base 20 and in a direction opposite to the post 40. A circumferential groove 28 is defined in the support portion 22 adjacent the bottom surface 24 of the base 20. The groove 28 is adapted to receive a clip (not shown) therein, for attaching the heat sink 10 to the electronic device.

Figure 3:
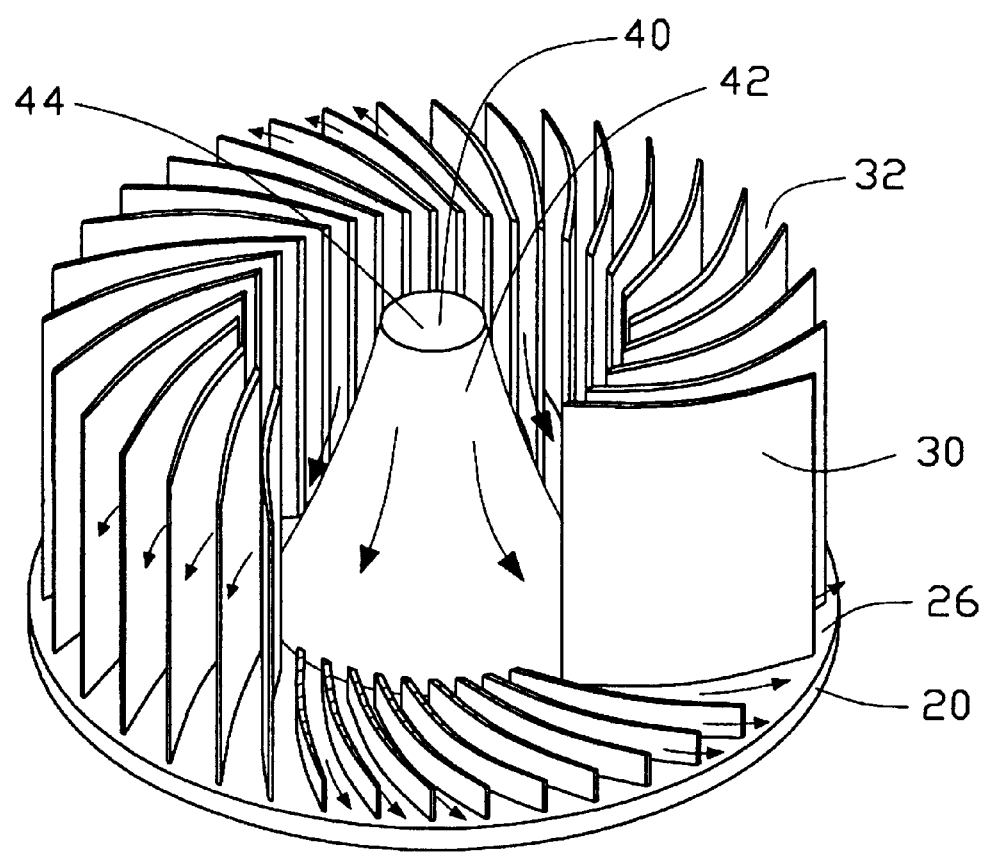
FIG. 3 is similar to FIG. 1, but with part of the heat sink cut away to illustrate forced convection airflow.

In FIG. 3, the arrows show directions of airflow emitted from the fan (not shown). When the fan operates, a large amount of cooling air is forced into the heat sink 10. Part of the cooling air passes the concave side surface 42 of the post 40 and then enters the gaps 32. Another part of the cooling air directly enters the gaps 32. All cooling air in the gaps 32 then exits the heat sink 10 into the surrounding environment. Thus, a downward and outward airflow field is formed in the heat sink 10. Heat radiated by the heat sink 10 is removed from the vicinity of the heat sink 10.

Advantages of the present invention are manifold. The fins 30 are identical in height to the post 40. Thus when the fan is attached to the heat sink 10, cooling air emitted by the fan passes directly into the heat sink 10. The second surface 44 of the post 40 is dimensioned according to the configuration of the fan. This minimizes blockage by the post 40 of cooling air emitted from the fan. The concave side surface 42 of the post 40 minimizes resistance to incoming cooling air while simultaneously directing such air toward the gaps 32. The fins 30 are curved, aligned, and spaced from each other at uniform intervals corresponding to directions of airflow generated from the fan. This minimizes resistance to cooling air entering the gaps 32 directly from the fan. It also minimizes resistance to cooling air entering the gaps 32 from space adjacent the post 40. As a result, resistance to air exiting the gaps 32 is also minimized. Thus the heat sink 10 substantially enhances the efficiency of forced convection of any given fan.

Figure 4:
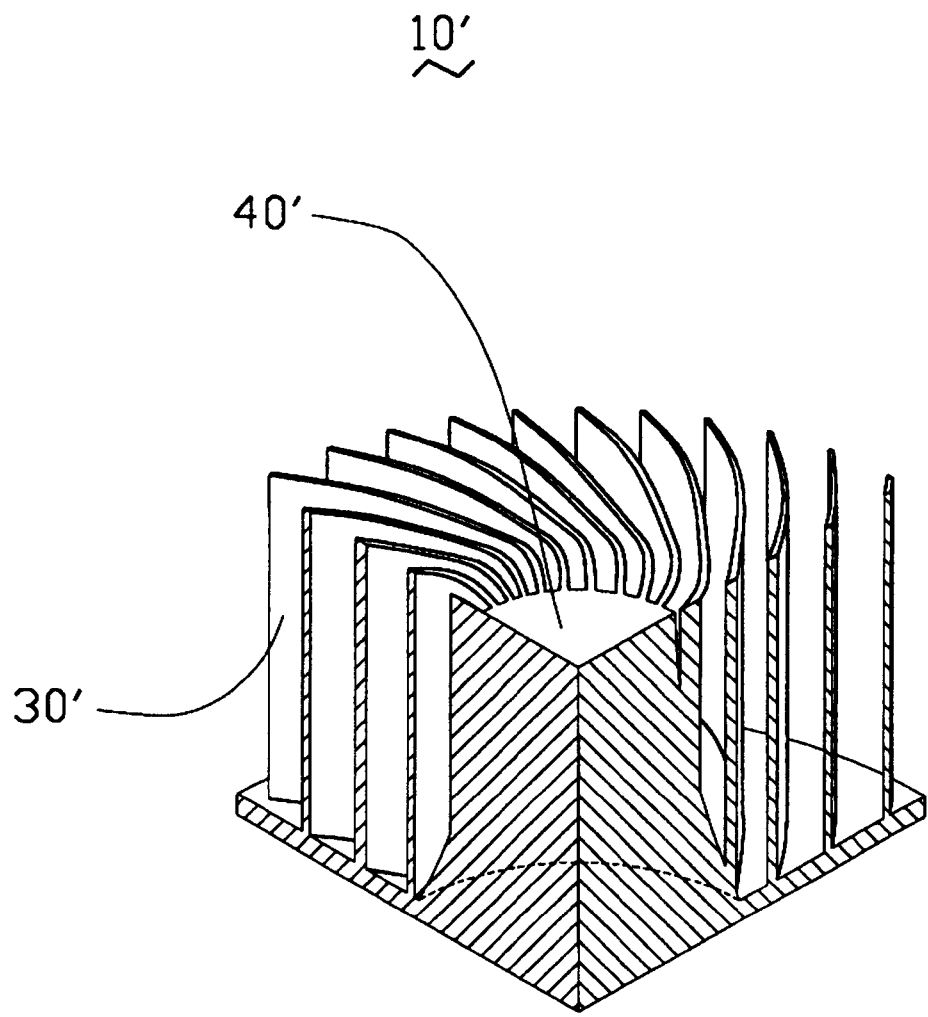
FIG. 4 is a perspective cutaway view of a heat sink in accordance with an alternative embodiment of the present invention.

FIG. 4 shows a heat sink 10' in accordance with an alternative embodiment of the present invention. The heat sink 10' is similar to the heat sink 10 of the preferred embodiment. However, the fins 30' are connected to the post 40'. For brevity, a detailed description of the heat sink 10' is omitted herein. Instead, reference is made to the detailed description of the heat sink 10, with due alteration of details.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink comprising:

a circular base adapted to be in thermal contact with an electronic device;

a post extending from a top surface of the base, the post being coaxial with the base and having a first substantially round surface connected to the top surface, a second substantially round surface smaller than the first surface and a concave side surface connected between the first and second surfaces, thereby minimizing resistance to incoming airflow and directing airflow toward an exterior of the heat sink; and a plurality of fins extending from the top surface of the base around the post;

wherein a support portion extends from the base adapted for contacting the electronic device and removing heat therefrom, and the support portion defines a groove adjacent a conjunction of the base and the support portion, the groove having a diameter less than a diameter of the support portion and adapted to receive a clip thereby attaching the heat sink to the electronic device.

2. The heat sink as recited in claim 1, wherein the second surface is adapted to support a fan thereon and dimensioned to minimize blockage of cooling air emitted from the fan.

3. The heat sink as recited in claim 1, wherein the fins are curved corresponding to directions of airflow generated from a fan, thereby minimizing resistance to airflow.

4. The heat sink as recited in claim 1, wherein the fins are aligned corresponding to directions of airflow generated from a fan, thereby minimizing resistance to airflow.

5. The heat sink as recited in claim 1, wherein the fins are spaced from each other at uniform intervals, thereby providing maximized airflow access.

6. The heat sink as recited in claim 1, wherein the fins are substantially identical in height to the post.

7. The heat sink as recited in claim 1, wherein the fins are spaced from the post.

8. The heat sink as recited in claim 1, wherein the fins are connected to the side surface of the post.

9. A heat sink comprising:

a circular base;

a post extending from a top surface of the base and adapted for supporting a fan; and a plurality of fins extending from the top surface around the post, the fins being curved corresponding to directions of airflow generated from a fan, thereby minimizing resistance to airflow;

wherein a support portion extends from the base adapted for contacting the electronic device and removing heat therefrom, and the support portion defines a groove adjacent a conjunction of the base and the support portion, the groove having a diameter less than a diameter of the support portion and adapted to receive a clip thereby attaching the heat sink to an electronic device.

10. The heat sink as recited in claim 9, wherein the fins are spaced from each other at uniform intervals, thereby providing maximized airflow access.

11. The heat sink as recited in claim 9, wherein the fins are substantially identical in height to the post.

12. The heat sink as recited in claim 9, wherein the post comprises a first substantially round surface connected to the top surface of the base, a second substantially round surface smaller than the first surface and a concave side surface connected between the first and second surfaces, thereby minimizing resistance to incoming airflow and directing airflow toward an exterior of the heat sink.

* * * * *